United States Patent
Hsieh et al.

[11] Patent Number: 6,090,674
[45] Date of Patent: Jul. 18, 2000

[54] METHOD OF FORMING A HOLE IN THE SUB QUARTER MICRON RANGE

[75] Inventors: Hung-Chang Hsieh, Hsin-Chu; Hua-Tai Lin, Yung-Kang Town; Jhon-Jhy Liaw, Taipei; Jin-Yuan Lee, Hsin-Chu, all of Taiwan

[73] Assignee: Taiwan Semiconductor Manufacturing Company, Hsin-Chu, Taiwan

[21] Appl. No.: 09/188,523

[22] Filed: Nov. 9, 1998

[51] Int. Cl.$^7$ ................................................ H01L 21/336
[52] U.S. Cl. .......................... 438/301; 438/952; 438/636; 438/637; 438/233; 438/700
[58] Field of Search .................... 438/952, 636, 438/637, 233, 700, 606

[56] References Cited

U.S. PATENT DOCUMENTS

| | | | |
|---|---|---|---|
| 5,468,342 | 11/1995 | Nulty et al. | 156/643.1 |
| 5,518,962 | 5/1996 | Murao . | |
| 5,578,524 | 11/1996 | Fukase et al. . | |
| 5,595,938 | 1/1997 | Miyazaki | 437/195 |
| 5,661,344 | 8/1997 | Havemann et al. | 257/758 |
| 5,670,423 | 9/1997 | Yoo | 437/192 |
| 5,882,999 | 3/1999 | Anderson et al. . | |
| 5,920,796 | 7/1999 | Wang et al. . | |
| 5,922,622 | 7/1999 | Lee et al. . | |
| 5,976,966 | 11/1999 | Inoue . | |
| 5,985,753 | 8/1998 | Yu et al. . | |
| 6,025,255 | 6/1998 | Chen et al. . | |

*Primary Examiner*—Richard Booth
*Assistant Examiner*—Jonathan Hack
*Attorney, Agent, or Firm*—George O. Saile; Stephen B. Ackerman

[57] ABSTRACT

Improved etching of sub-micron diameter via or contact holes in integrated circuits is achieved by first coating the dielectric layer through which the hole is to be etched with successive layers of titanium and silicon oxynitride. This is followed by coating with a conventional photoresist mask which is thinner than usual, thereby allowing for improved resolution. Etching is carried out in two stages. First, only the oxynitride and titanium layers are etched with minimal penetration into the dielectric. In this way a hard mask of titanium is formed. It's optical fidelity is excellent since the combination of silicon oxynitride and titanium act as a very efficient anti-reflection coating. Etching of the hole is then completed using a different etch which also removes the remaining photoresist, the silicon oxynitride as well as some of the titanium. Provided the thicknesses of the layers are within the ranges taught by the invention, a via/contact hole of uniform cross-section and, having the correct diameter, will be formed.

19 Claims, 3 Drawing Sheets

METHOD OF FORMING A HOLE IN THE SUB QUARTER MICRON RANGE

FIELD OF THE INVENTION

The invention relates to the general field of integrated circuits with particular reference to etching accurate via/contact holes whose diameters are in the sub-micron range.

BACKGROUND OF THE INVENTION

The critical dimensions associated with integrated circuits continue to grow ever smaller. For example, contact holes and via holes which allow communication between levels now have dimensions that are often less than ¼ micron. Thus, dimensional control of photoresist masks can be a difficult problem because of phenomena such as the optical proximity effect. Also, problems such as under-cutting and slow consumption of the photoresist mask by the etchant become major problems. The latter difficulty is often overcome by using a hard mask i.e. a mask made of material other than photoresist which is much more resistant to the etchant. To overcome the former difficulty, standard optical proximity corrections are often used in conjunction with an anti-reflection coating (ARC). The present invention sets out to combine both remedies into a single process.

In the course of searching the literature we have found a number of references that deal with aspects of the problem but none that dealt with it in exactly the manner of the present invention. The following were found to be of interest:

Yoo (U.S. Pat. No. 5,670,423 SEPTEMBER 1997) describes a method for using a disposable hard mask for control of gate critical dimension. He shows the use of titanium as a bottom ARC (anti-reflection coating). A feature of the invention is that the hard mask is disposable. Nulty et al. (U.S. Pat. No. 5,468,342 November 1995) also teaches how an oxide layer may be etched by using such a hard mask. Miyazaki (U.S. Pat. No. 5,595,938 JANUARY 1997) shows how a metal may be patterned by using a metal oxide ARC layer. This allows the interconnection layer and the anti-reflection layer to be treated with the same etchant. Havemann et al. (U.S. Pat. No. 5,661,344 August 1997) also describes how a via hole may be formed by using an oxide hard mask.

SUMMARY OF THE INVENTION

It has been an object of the present invention to provide a method for forming a via hole or a contact hole in an integrated circuit.

It has been a further object of the invention that the diameter of said hole be less than one micron and possibly less than ¼ micron.

Another object of the invention has been to eliminate problems of an optical nature simultaneously with problems associated with etching.

These objects have been achieved by first coating the dielectric layer through which the hole is to be etched with successive layers of titanium and silicon oxynitride. This is followed by coating with photoresist and the formation of the desired mask in the usual way except that a thinner than usual layer may be used, thereby allowing for improved resolution. Etching is carried out in two stages. First, only the oxynitride and titanium layers are etched with minimal penetration into the dielectric. In this way a hard mask of titanium is formed. Its optical fidelity is excellent since the combination of silicon oxynitride and titanium act as a very efficient anti-reflection coating. Etching of the hole is then completed using a different etch which also removes the remaining photoresist, the silicon oxynitride and some of the titanium. Provided the thicknesses of the layers are within the ranges taught by the invention, a via/contact hole of uniform cross-section and, having the correct diameter, will be formed.

DESCRIPTION OF THE PREFERRED EMBODIMENTS

Although the present invention is described in the context of forming a via hole during the manufacture of an integrated circuit, it will be understood by those skilled in the art that the method is more general and is applicable to any situation where a hole having a very small diameter (typically less than ¼ micron) has to be etched through a dielectric layer.

A major application of the method of the present invention is making contact to a field effect transistor from some higher level within an integrated circuit. We assume that said field effect transistor has been formed in the usual way. That is, a layer of gate oxide was formed on the surface of a silicon wafer following which a layer of polysilicon was deposited over the oxide and patterned and etched to form a gate pedestal. Source and drain regions were then formed on opposing sides of this gate pedestal following which a SALICIDE process was used for making selective contact to the source, drain, and gate regions. Once the device had been formed, it was over coated with a dielectric layer shown in FIG. 1 as layer 2, with layer 1 representing some portion of the FET to which contact needs to be made from a layer located on the top surface of layer 2.

The problem to be solved is how to make effective contact to layer 1 through dielectric layer 2. In particular, difficulties arise in forming a high-quality photoresist mask (particularly for the small size opening that is involved here). Because of reflections from the surface of dielectric 2, standing waves form in the photoresist during the exposure and these interfere with the quality of the result. As discussed earlier, it is common practice to use an ARC in order to mitigate this problem. There are also additional problems associated with etching such small holes. In particular, the etchants in common use are often not selective enough, relative to the photoresist, so that poor quality holes are obtained.

The present invention provides a solution to both these problems by combining the action of the ARC with the formation of a suitable hard mask. Continuing our reference to FIG. 1, we show layers 3 and 4 of titanium and silicon oxynitride respectively. Typically, dielectric layer 2 would comp rise silicon oxide or a similar material such as BPSG (borophosphosilicate glass), SOG (spin on glass), and sputterred quartz and would be between about 1,000 and 40,000 Angstroms thick.

Figure 1:
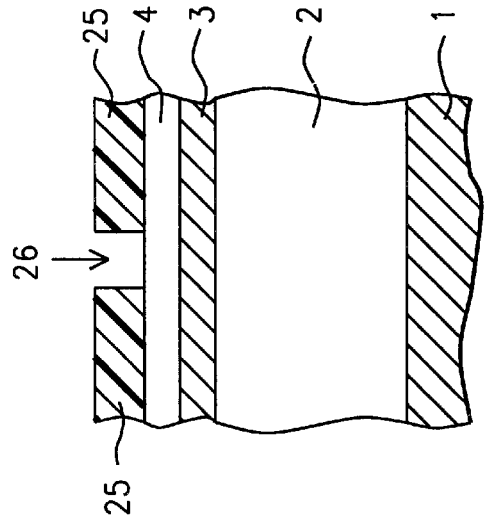
FIG. 1 illustrates a cross-section of a portion of an integrated circuit, covered by an inter-metallic-dielectric layer which has been covered by layers of titanium and silicon oxynitride.

Titanium layer 3 (as shown in FIG. 1) is between about 100 and 1,500 Angstroms thick while silicon oxynitride layer 4 is between about 200 and 2,000 Angstroms thick. As will be discussed further on these thicknesses are chosen to minimize reflections from the surface of dielectric layer 2. The titanium layer was deposited by means of sputtering while the layer of silicon oxynitride was deposited by CVD (chemical vapor deposition) using a mix of $SiH_4$, $N_2O$, and He at a pressure between about 5 and 10 torr and about 130 watts of RF power.

Figure 2:
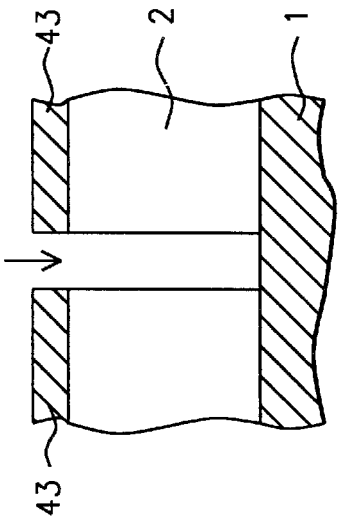
FIG. 2 shows the structure of FIG. 1 after coating with a layer of photoresist which has been developed into a pattern for etching a contact/via hole.

Referring now to FIG. 2, we show the structure of FIG. 1 after it has been coated with photoresist layer 25 which, after patterning and etching, covers the entire structure except for opening 26 which will be used for etching a via or contact hole that will extend all the way through dielectric layer 2 to silicon body 1. Etching of the hole is now performed in two steps. First, the etchant is used to form the hole to a depth limited to layers 3 and 4 with minimal penetration into the dielectric, thereby making a hard mask from these layers. The etchant used was a mix of $CHF_3$ (45 SCCM), $CF_4$ (45 SCCM), argon (100 SCCM), and nitrogen (10 SCCM) at a pressure between about 150 and 200 mtorr at a temperature between about 20 and 100° C. for between about 20 and 60 seconds. The power level used was about 1,100 watts.

Figure 3:
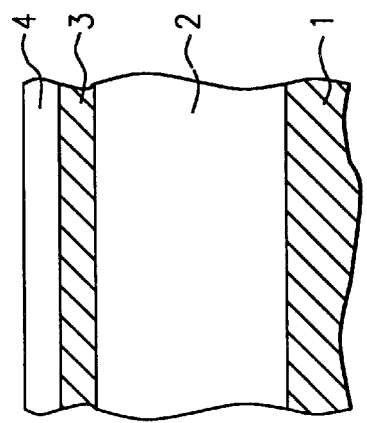
FIG. 3 illustrates the first stage in the etching of a hole whereby a hard mask is formed.

The appearance of the structure after the first etching step is illustrated in FIG. 3. As can be seen, the original opening 26 in photoresist layer 25 has now being transformed to opening 36 in hard mask 35. The thicknesses of titanium layer 33 and silicon oxynitride layer 34 are now essentially unchanged. However, in the course of etching hole 36 most of the photoresist layer has been consumed.

Figure 4:
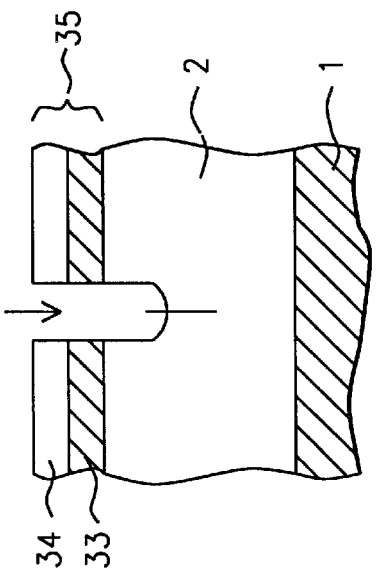
FIG. 4 shows the completed hole with all the silicon oxynitride removed as well as some of the titanium.

To complete the etching of the via/contact hole, a different etchant was used. This was carbon hexafluoride or carbon tetrafluoride which was used at a temperature between about 20 and 100° C. for between about 2 and 4 minutes. The result is illustrated in FIG. 4 showing completed via/contact hole 46 that runs through the entire thickness of the dielectric layer all the way to the silicon surface. In the course of performing the second etching step all of the silicon oxynitride is consumed and a small amount of the titanium is also removed so that the remaining titanium layer 43 is only about 200 Angstroms thinner than the original layer 3.

Figure 5:
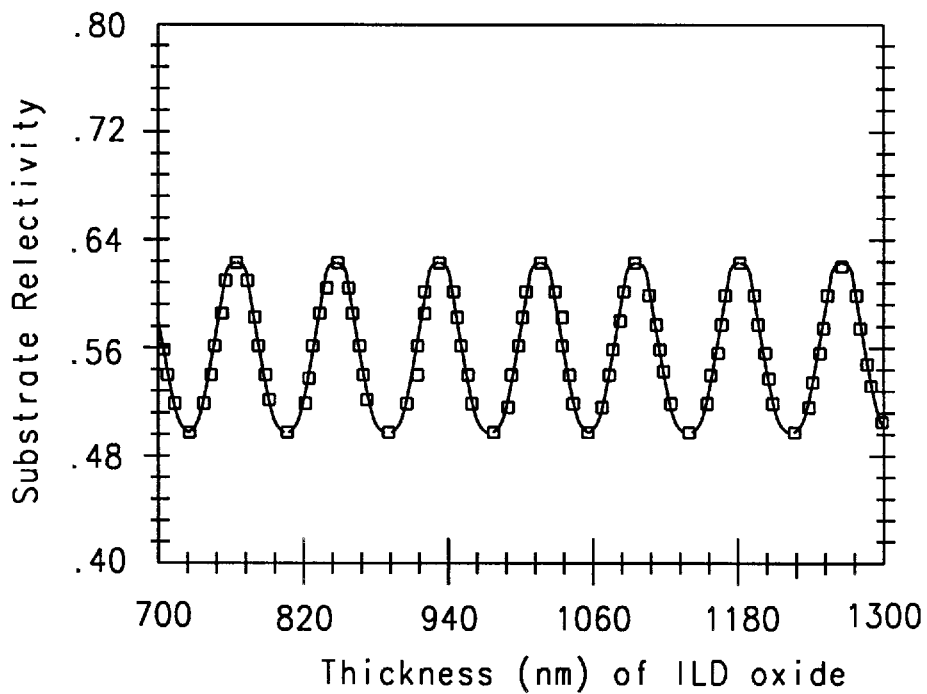
FIG. 5 plots substrate reflectivity as a function of ILD thickness.

It is important to understand that the thicknesses of the titanium and silicon oxynitride layers must be within the ranges quoted above for the method of the present invention to work effectively. This can be understood by reference to FIG. 5 which is a plot of the substrate reflectivity. Since reflected light comes from both the top surface of the dielectric layer as well as from the dielectric to silicon interface, interference effects cause the measured reflectivity to be a periodic function of the thickness of the dielectric, (as expected).

Figure 6:
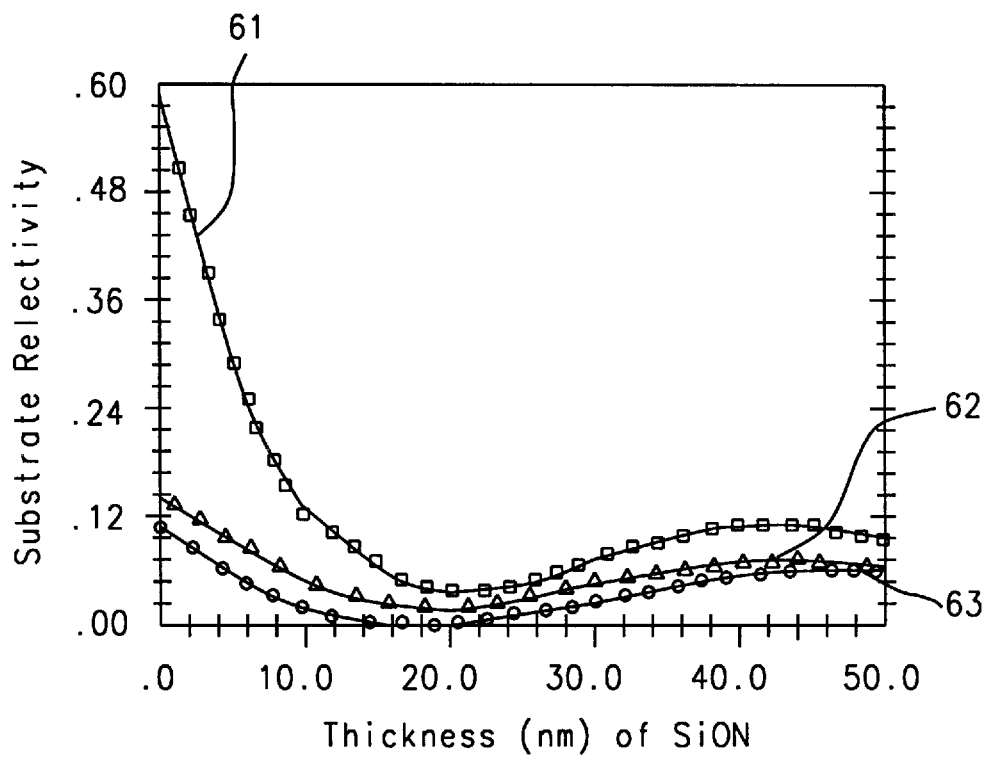
FIG. 6 plots the variation of substrate reflectivity with silicon oxynitride thickness for several titanium thicknesses.

By depositing an anti-reflection coating on the surface of the dielectric this substrate reflectivity can be significantly reduced. FIG. 6 is a plot of the substrate reflectivity as a function of the silicon oxynitride thickness for several different titanium thicknesses. Curve 61 is for the case of zero titanium thickness. This shows that even without any titanium at all it is possible to reduce the reflectance to zero for a silicon oxynitride thickness of 20 nm. However, for curve 61 there is an unacceptable increase in the reflectance for other thicknesses. Curve 62 is for a titanium layer 10 nm thick while curve 63 is for a titanium thickness of about 20 nm. It is readily seen that the addition of the titanium reduces the sensitivity of reflectance to silicon oxynitride thickness substantially.

Figure 7:
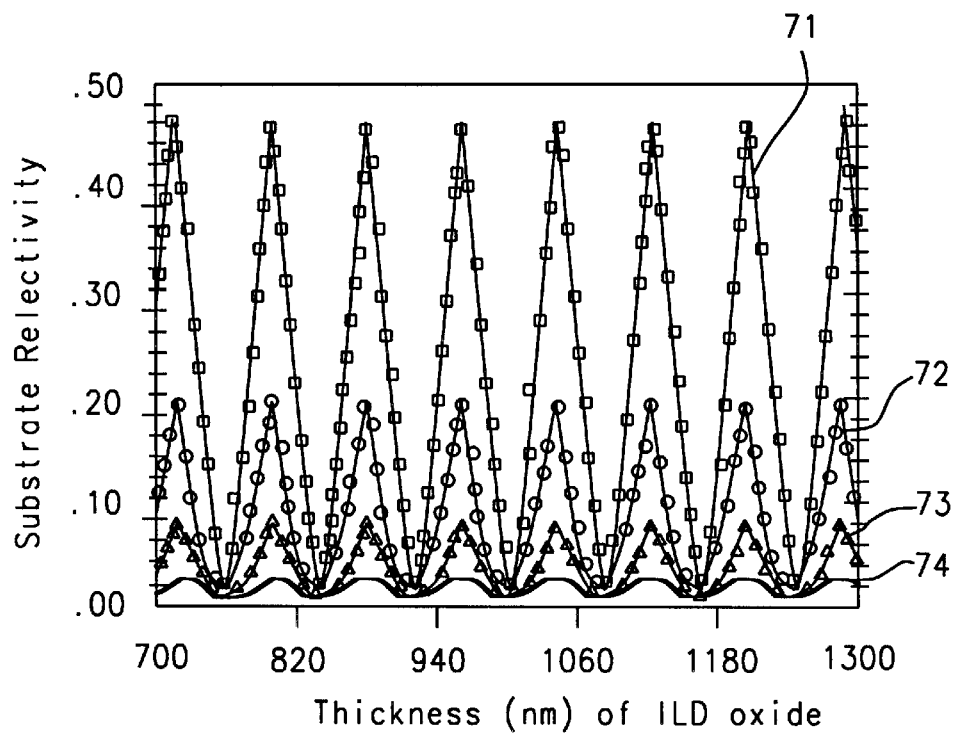
FIG. 7 plots substrate reflectivity vs. ILD thickness for several different titanium thicknesses.

FIG. 7 is a plot of substrate reflectivity as a function of dielectric layer thickness for a number of different titanium layer thicknesses while curve 71 shows the substrate reflectivity with no titanium present. Curve 72 is for the case of a titanium layer that is 10 nm thick, curve 73 is for a layer 20 nm thick, and curve 74 is for a layer 40 nm thick. This data shows that, given the correct thickness of titanium the substrate reflectivity can be effectively reduced to almost zero.

Figure 8:
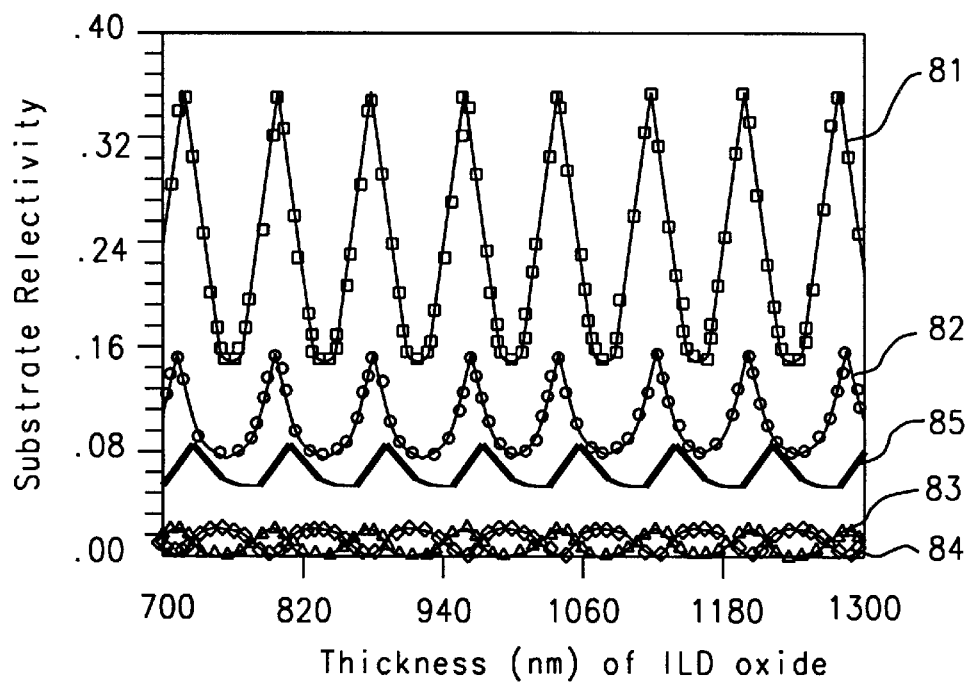
FIG. 8 plots substrate reflectivity vs. ILD thickness for several different silicon oxynitride thicknesses.

FIG. 8 is a plot of substrate reflectivity as a function of the dielectric layer thickness for various thicknesses of silicon oxynitride. Curve 81 is for no silicon oxynitride. Curve 82 is for a layer 10 nm thick, curves 83 and 84 are for thicknesses of 30 and 40 nm respectively. Of particular interest is curve 85 which is for a silicon oxynitride thickness of 50 nm. This illustrates that the critical thickness of silicon oxynitride is between about 30 or 40 nm.

For a titanium thickness greater than about 150 Angstroms (with optional SiON) the substrate reflectivity could be effectively reduced. For titanium thicknesses greater than about 300 Angstroms, reflectivity changes very little with thickness unless the SiON is also used.

Finally, it is important to note that the practice of the invention as taught above allows a thinner layer of photoresist to be used when defining the area that is to be etched. This is because in the first stage of etching the via/contact hole the depth of etching is relatively shallow so use of the thinner photoresist mask is possible. This in turn, leads to more faithful reproduction of the hole's dimensions, an important consideration when working in the sub micron range.

While the invention has been particularly shown and described with reference to the preferred embodiments thereof, it will be understood by those skilled in the art that various changes in form and details may be made without departing from the spirit and scope of the invention.

What is claimed is:

1. A method of etching a sub micron diameter hole in a dielectric layer comprising:

depositing a layer of titanium on said dielectric layer;

depositing a layer of silicon oxynitride on said layer of titanium, thereby forming an anti-reflective coating;

forming a photoresist pattern, that defines a via hole, on said layer of silicon oxynitride;

etching through the silicon oxynitride layer, and the titanium, as far as said dielectric layer, using a first etching procedure; and using said silicon oxynitride and titanium layers as a mask, etching the dielectric layer to the level of the substrate, by means of a second etching procedure.

2. The method of claim 1 wherein the dielectric layer has a thickness between about 1,000 and 40,000 Angstroms.

3. The method of claim 1 wherein said layer of silicon oxynitride has a thickness between about 200 and 2,000 Angstroms.

4. The method of claim 1 wherein said layer of titanium has a thickness between about 100 and 1,500 Angstroms.

5. The method of claim 1 wherein said first etching procedure further comprises using a mix of $CHF_3$, $CF_4$, argon and nitrogen at a pressure between about 150 and 200 mtorr for between about 20 and 60 seconds.

6. The method of claim 1 wherein said second etching procedure further comprises using carbon hexafluoride or carbon tetrafluoride at a temperature between about 20 and 100° C. for between about 2 and 4 minutes.

7. The method of claim 1 wherein the substrate is silicon.

8. The method of claim 1 wherein the dielectric is selected from the group consisting of silicon oxide, BPSG, SOG, and sputtered quartz.

9. The method of claim 1 wherein the step of depositing a layer of silicon oxynitride further comprises chemical vapor deposition using a mix of $SiH_4$, $N_2O$, and He at a pressure between about 5 and 10 torr and about 130 watts of RF power.

10. A method of forming a via hole having a sub micron diameter in an integrated circuit, comprising:

providing a body of silicon;

forming a layer of gate oxide on a surface of said silicon body;

depositing a layer of polysilicon on said surface and then patterning and etching said polysilicon to form a gate pedestal;

forming source and drain regions on opposing sides of said gate pedestal and then making selective contact to said source, drain, and gate regions by means of a SALICIDE process;

coating said field effect transistor with a dielectric layer;

depositing a layer of titanium on said dielectric layer;

depositing a layer of silicon oxynitride on said layer of titanium thereby forming an anti-reflective coating;

forming a photoresist pattern, that defines a via hole, on said layer of silicon oxynitride;

etching through the silicon oxynitride layer, and the titanium, as far as said dielectric layer using a first etching procedure; and using said silicon oxynitride and titanium layers as a mask, etching the dielectric layer down to the level of the selective contacts, by means of a second etching procedure.

11. The method of claim 10 wherein the dielectric layer has a thickness between about 1,000 and 40,000 Angstroms.

12. The method of claim 10 wherein said layer of silicon oxynitride has a thickness between about 200 and 2,000 Angstroms.

13. The method of claim 10 wherein said layer of titanium has a thickness between about 100 and 1,500 Angstroms.

14. The method of claim 10 wherein said first etching procedure further comprises using a mix of $CHF_3$, $CF_4$, argon and nitrogen at a pressure between about 150 and 200 mtorr for between about 20 and 60 seconds.

15. The method of claim 10 wherein said second etching procedure further comprises using carbon hexafluoride or carbon tetrafluoride at a temperature between about 20 and 100° C. for between about 2 and 4 minutes.

16. The method of claim 10 wherein said field effect transistor is of the LDD type.

17. The method of claim 10 wherein said dielectric layer is selected from the group consisting of sputtered quartz, BPSG, SOG, and PE oxide.

18. The method of claim 10 wherein the step of depositing a layer of silicon oxynitride further comprises plasma enhanced PVD.

19. The method of claim 10 wherein the step of depositing a dielectric layer further comprises chemical vapor deposition using a mix of $SiH_4$, $N_2O$, and He at a pressure between about 5 and 10 torr and about 130 watts of RF power.

* * * * *